US012660658B2

(12) United States Patent
Takao et al.

(10) Patent No.: US 12,660,658 B2
(45) Date of Patent: Jun. 16, 2026

(54) SEMICONDUCTOR DEVICE AND METHOD OF MANUFACTURING THE SAME

(71) Applicant: AOI ELECTRONICS CO., LTD., Takamatsu (JP)

(72) Inventors: Katsuhiro Takao, Kagawa (JP); Atsushi Kuroha, Kagawa (JP); Yoshiaki Aizawa, Kagawa (JP)

(73) Assignee: AOI ELECTRONICS CO., LTD., Kagawa (JP)

( * ) Notice: Subject to any disclaimer, the term of this patent is extended or adjusted under 35 U.S.C. 154(b) by 393 days.

(21) Appl. No.: 18/563,173

(22) PCT Filed: Feb. 14, 2022

(86) PCT No.: PCT/JP2022/005700
§ 371 (c)(1),
(2) Date: Nov. 21, 2023

(87) PCT Pub. No.: WO2022/249578
PCT Pub. Date: Dec. 1, 2022

(65) Prior Publication Data
US 2024/0266277 A1 Aug. 8, 2024

(30) Foreign Application Priority Data
May 24, 2021 (JP) ................................ 2021-086983

(51) Int. Cl.
| | |
|---|---|
| *H10W 70/65* | (2026.01) |
| *H10W 72/00* | (2026.01) |
| *H10W 74/10* | (2026.01) |
| *H10W 90/00* | (2026.01) |
| H02M 3/00 | (2006.01) |
| H10W 72/20 | (2026.01) |

(52) U.S. Cl.
CPC ......... *H10W 70/65* (2026.01); *H10W 72/071* (2026.01); *H10W 74/111* (2026.01);
(Continued)

(58) Field of Classification Search
None
See application file for complete search history.

(56) References Cited

U.S. PATENT DOCUMENTS

| | | | | |
|---|---|---|---|---|
| 7,663,211 B2 * | 2/2010 | Noquil | ................. | H10W 74/111 |
| | | | | 257/E23.034 |
| 10,121,742 B2 * | 11/2018 | Yeo | ........................ | H10W 20/43 |

(Continued)

FOREIGN PATENT DOCUMENTS

| | | |
|---|---|---|
| DE | 102014109909 A1 | 1/2015 |
| JP | 2006-216940 A | 8/2006 |

(Continued)

OTHER PUBLICATIONS

International Search Report mailed on Apr. 19, 2022, in connection with corresponding International Application No. PCT/JP2022/005700 (5 pp., including machine-generated English translation).

*Primary Examiner* — Michelle Mandala
(74) *Attorney, Agent, or Firm* — McCormick, Paulding & Huber PLLC

(57) ABSTRACT

Performance of a semiconductor device is improved. A semiconductor device 1 includes a die pad 2a made of a conductive material, a semiconductor chip CHI provided on an upper surface of the die pad 2a, and a semiconductor chip CH3. The semiconductor chip CHI has a gate pad electrode GP1 and a drain pad electrode DP1, and the semiconductor chip CH3 has a pad electrode AP1. A conductive layer 3 is provided on each upper surface of the gate pad electrode GP1 and the pad electrode AP1 so as to be electrically connected to the gate pad electrode GP1 and the pad electrode AP1. The die pad 2a, the semiconductor chip CH1, the semiconductor chip CH3, and the conductive layer 3 are sealed with a resin layer 5 such that an upper surface of the conductive layer 3 and a lower surface of die pad 2a are (Continued)

A-A CROSS SECTION exposed. A passive element member 7 including one or more passive elements is provided on upper surfaces of the two conductive layers 3.

20 Claims, 9 Drawing Sheets

(52) U.S. Cl.
CPC ............ *H10W 90/00* (2026.01); *H02M 3/003* (2021.05); *H10W 72/01953* (2026.01); *H10W 72/20* (2026.01); *H10W 90/736* (2026.01); *H10W 90/796* (2026.01)

(56) References Cited

U.S. PATENT DOCUMENTS

| | | | |
|---|---|---|---|
| 2005/0218489 | A1 | 10/2005 | Satou et al. |
| 2006/0169976 | A1 | 8/2006 | Kameda et al. |
| 2011/0248392 | A1 | 10/2011 | Javier et al. |
| 2015/0028448 | A1 | 1/2015 | Hosseini et al. |
| 2015/0206830 | A1* | 7/2015 | Takada ................ H10W 70/466 257/676 |
| 2017/0309554 | A1 | 10/2017 | Mangrum et al. |
| 2018/0269147 | A1 | 9/2018 | Yeo et al. |
| 2020/0043881 | A1 | 2/2020 | Lin |

FOREIGN PATENT DOCUMENTS

| | | | |
|---|---|---|---|
| JP | 2009-124052 | A | 6/2009 |
| JP | 2010-147501 | A | 7/2010 |
| JP | 2013-524552 | A | 6/2013 |
| JP | 5983523 | B2 | 8/2016 |
| JP | 2020-167748 | A | 10/2020 |
| TW | 201717330 | A | 5/2017 |
| TW | 201836104 | A | 10/2018 |
| TW | 202113991 | A | 4/2021 |
| WO | 2014202282 | A1 | 12/2014 |

* cited by examiner

A-A CROSS SECTION

A-A CROSS SECTION

A-A CROSS SECTION

A-A CROSS SECTION

A-A CROSS SECTION

A-A CROSS SECTION

A-A CROSS SECTION

A-A CROSS SECTION

A-A CROSS SECTION

A–A CROSS SECTION

A–A CROSS SECTION

A-A CROSS SECTION

1

SEMICONDUCTOR DEVICE AND METHOD OF MANUFACTURING THE SAME

CROSS-REFERENCE TO RELATED APPLICATIONS

This application is a National Stage application of International Patent Application No. PCT/JP2022/005700, filed on Feb. 14, 2022, which claims priority to Japanese Patent Application No. 2021-086983, filed on May 24, 2021, each of which is hereby incorporated by reference in its entirety.

TECHNICAL FIELD

The present invention relates to a semiconductor device and a method of manufacturing the same, in particular, a resin-sealed semiconductor device and a method of manufacturing the same.

BACKGROUND

For example, Patent Document 1 discloses an electronic device in which a plurality of electronic components such as a semiconductor chip and a passive element are mounted on an upper surface of a multi-layered board in which a plurality of wirings are stacked. Further, each electronic component is connected to each wiring arranged on the upper surface of the multi-layered board by a bonding wire.

Moreover, Patent Document 2 discloses a device in which a semiconductor chip is mounted on an upper surface of a lead frame via bumps. Further, terminals formed by etching the same material as the lead frame are provided around the lead frame, and an electrical path of the semiconductor chip is pulled up to an upper surface side of the device via the lead frame and the terminals.

Patent Document 1: Japanese Patent No. 5983523
Patent Document 2: Japanese Unexamined Patent Application Publication No. 2013-524552

SUMMARY

Problems to be Solved by the Invention

Patent Document 1 adopts the surface mounting in which a plurality of electronic components are mounted on an upper surface of a multi-layered board, and thus the resistance and inductance between respective components increase due to the influence of bonding wires and stacked wirings and switching loss is likely to occur. Furthermore, since the mounting area (package size) increases as the number of components increases in the surface mounting, it is difficult to promote the package miniaturization. In addition, the characteristics of a multi-layered board make it difficult to form the multi-chip configuration provided with power MOS transistors that require high heat dissipation.

Patent Document 2 adopts a flip-chip mounting structure using a lead frame, but since the electrical path from the semiconductor chip to the upper surface of the device is long, the resistance and inductance increase and the switching loss occurs as in Patent Document 1.

A main object of this application is to reduce the switching loss by suppressing the increase in resistance and inductance between a plurality of electronic components such as a semiconductor chip and a passive element. Namely, the main object of this application is to improve the performance of the semiconductor device. Other problems and novel features will become apparent from the description of this specification and the accompanying drawings.

Means for Solving the Problem

A semiconductor device according to an embodiment includes: a first die pad made of a conductive material; a first semiconductor chip provided on an upper surface of the first die pad; and a second semiconductor chip. Here, the first semiconductor chip has a first pad electrode formed on an upper surface of the first semiconductor chip and a third pad electrode formed on a lower surface of the first semiconductor chip and electrically connected to the first die pad, the second semiconductor chip has a second pad electrode formed on an upper surface of the second semiconductor chip, a first conductive layer is provided on an upper surface of the first pad electrode so as to be electrically connected to the first pad electrode, a second conductive layer is provided on an upper surface of the second pad electrode so as to be electrically connected to the second pad electrode, the first die pad, the first semiconductor chip, the second semiconductor chip, the first conductive layer, and the second conductive layer are sealed with a first resin layer such that an upper surface of the first conductive layer, an upper surface of the second conductive layer, and a lower surface of the first die pad are exposed, and one or more passive elements are disposed on each upper surface of the first conductive layer and the second conductive layer so as to be electrically connected to the first conductive layer and the second conductive layer.

A method of manufacturing a semiconductor device according to an embodiment includes steps of: (a) preparing a metal plate made of a conductive material, a first semiconductor chip having a first pad electrode formed on an upper surface thereof and a third pad electrode formed on a lower surface thereof, a second semiconductor chip having a second pad electrode formed on an upper surface thereof, a first conductive layer provided on an upper surface of the first pad electrode and electrically connected to the first pad electrode, and a second conductive layer provided on an upper surface of the second pad electrode and electrically connected to the second pad electrode; (b) after the step (a), disposing the metal plate on an upper surface of a base material; (c) after the step (b), forming a first die pad by selectively etching the metal plate; (d) after the step (c), disposing the first semiconductor chip on an upper surface of the first die pad such that the third pad electrode is electrically connected to the first die pad; (e) after the step (c), disposing the second semiconductor chip on the upper surface of the base material; (f) after the step (d) and the step (e), sealing the first die pad, the first semiconductor chip, the second semiconductor chip, the first conductive layer, and the second conductive layer with a first resin layer so as to cover each upper surface of the first conductive layer and the second conductive layer; (g) after the step (f), polishing the first resin layer to expose each upper surface of the first conductive layer and the second conductive layer from the first resin layer; (h) after the step (g), exposing a lower surface of the first die pad from the first resin layer by removing the base material; and (i) after the step (h), providing one or more passive elements on each upper surface of the first conductive layer and the second conductive layer so as to be electrically connected to the first conductive layer and the second conductive layer.

Effects of the Invention

According to one embodiment, it is possible to improve the performance of the semiconductor device.

BRIEF DESCRIPTIONS OF THE DRAWINGS

FIG. 11 is a cross-sectional view showing the method of manufacturing the semiconductor device subsequent to FIG. 10;

DETAILED DESCRIPTION

Figure 1:
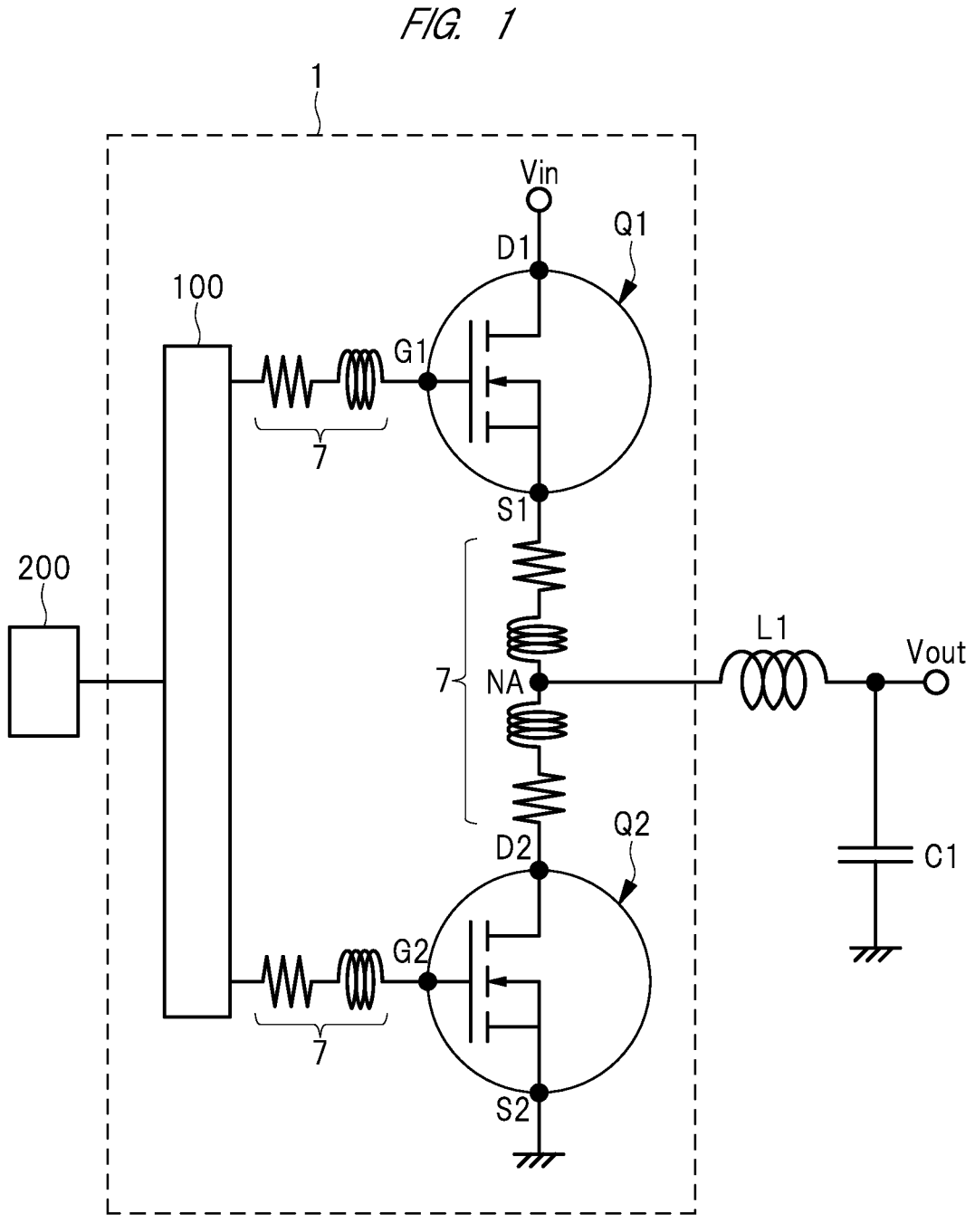
FIG. 1 is an equivalent circuit diagram showing a DC/DC converter according to the first embodiment.

Hereinafter, embodiments will be described in detail with reference to drawings. Note that the members having the same function are denoted by the same reference characters throughout the drawings for describing the embodiments, and the repetitive description thereof will be omitted. Further, in the following embodiments, the description of the same or similar part will not be repeated in principle unless particularly required.

Also, the X direction, the Y direction, and the Z direction in the description of this application cross each other and are orthogonal to each other. In the description of this application, the Z direction is defined as the longitudinal direction, the vertical direction, the height direction, or the thickness direction of a certain structure. Further, the expression "in plan view" used in this application means that a plane configured by the X direction and the Y direction is seen in the Z direction.

First Embodiment

<Circuit Configuration of Semiconductor Device>

FIG. 1 is an equivalent circuit diagram of a step-down DC/DC converter. A semiconductor device 1 according to the first embodiment constitutes a part of a DC/DC converter and includes a driver circuit 100, a high-side MOS transistor Q1, a low-side MOS transistor Q2, and others.

As shown in FIG. 1, in the DC/DC converter, the MOS transistor Q1 and the MOS transistor Q2 are connected in series between an input terminal Vin and a reference potential (ground potential). Also, a coil L1 is connected between a node NA between the MOS transistor Q1 and the MOS transistor Q2 and an output terminal Vout. A capacitor C1 is connected between the output terminal Vout and the coil L1.

The MOS transistor Q1 has a gate G1, a drain D1, and a source S1. The gate G1 is connected to the driver circuit 100, the drain D1 is connected to the input terminal Vin, and the source S1 is connected to a drain D2 of the MOS transistor Q2. The MOS transistor Q2 has a gate G2, the drain D2, and a source S2. The gate G2 is connected to driver circuit 100, the drain D2 is connected to the source S1, and the source S2 is connected to the reference potential.

Note that a passive element member 7 may be provided between the driver circuit 100 and the gate G1, between the driver circuit 100 and the gate G2, and between the source S1 and the drain D2. The passive element member 7 is one or more passive elements, and is composed of one or more resistance elements, one or more coils, one or more capacitors, or a combination thereof.

The driver circuit 100 is driven by a control signal supplied from a control circuit 200. The driver circuit 100 supplies signals for controlling the gate potentials of the MOS transistors Q1 and Q2 to the gates G1 and G2 of the MOS transistors Q1 and Q2, respectively. The driver circuit 100 controls on/off of the MOS transistor Q1 and on/off of the MOS transistor Q2. Specifically, the driver circuit 100 turns off the MOS transistor Q2 when turning on the MOS transistor Q1, and turns on the MOS transistor Q2 when turning off the MOS transistor Q1. In the DC/DC converter described above, the power supply voltage is converted by alternately turning on and off the MOS transistors Q1 and Q2 in synchronization with each other.

<Mounting Structure of Semiconductor Device>

Figure 2:
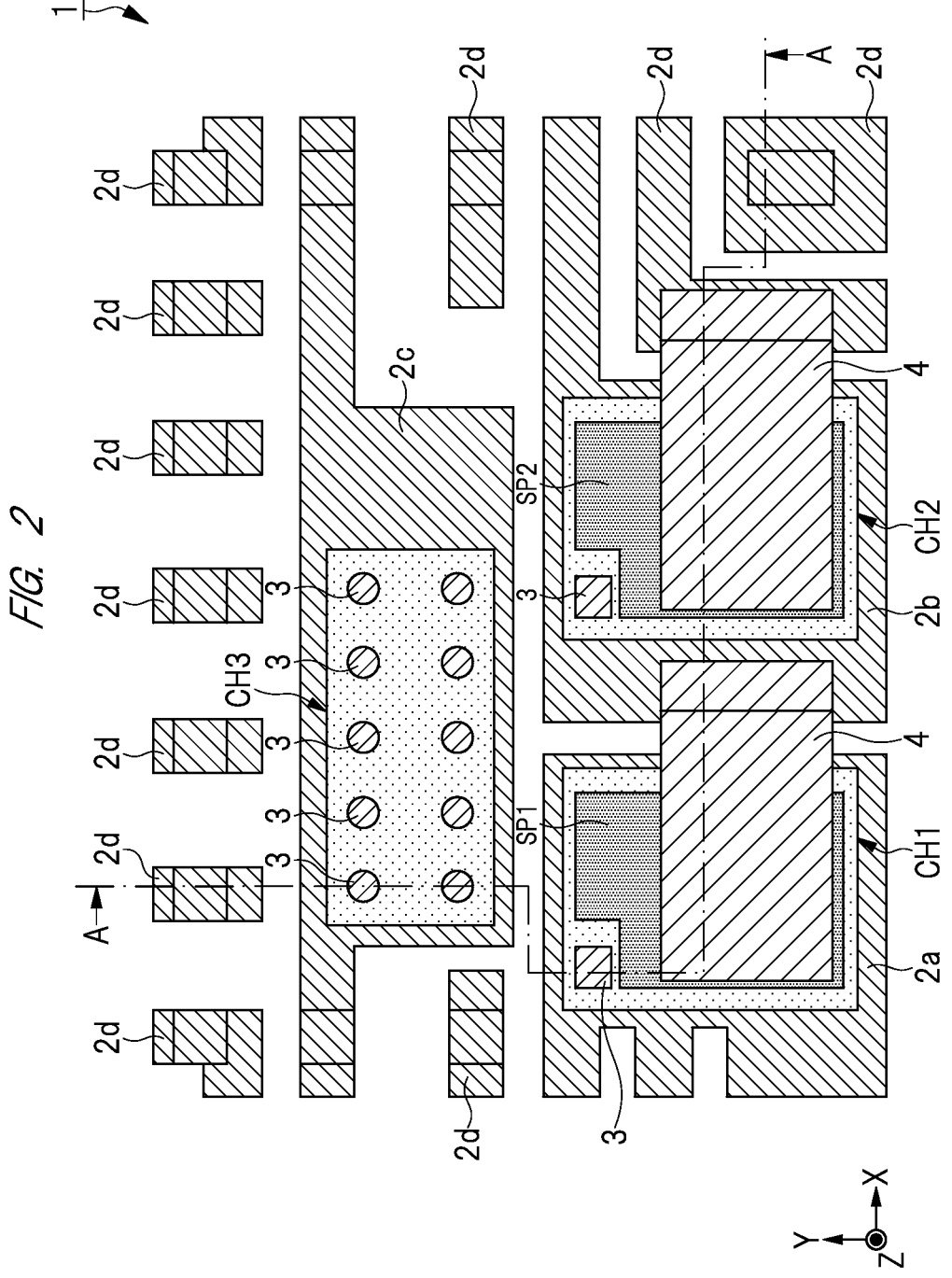
FIG. 2 is a plan view showing a semiconductor device according to the first embodiment.
Figure 3:
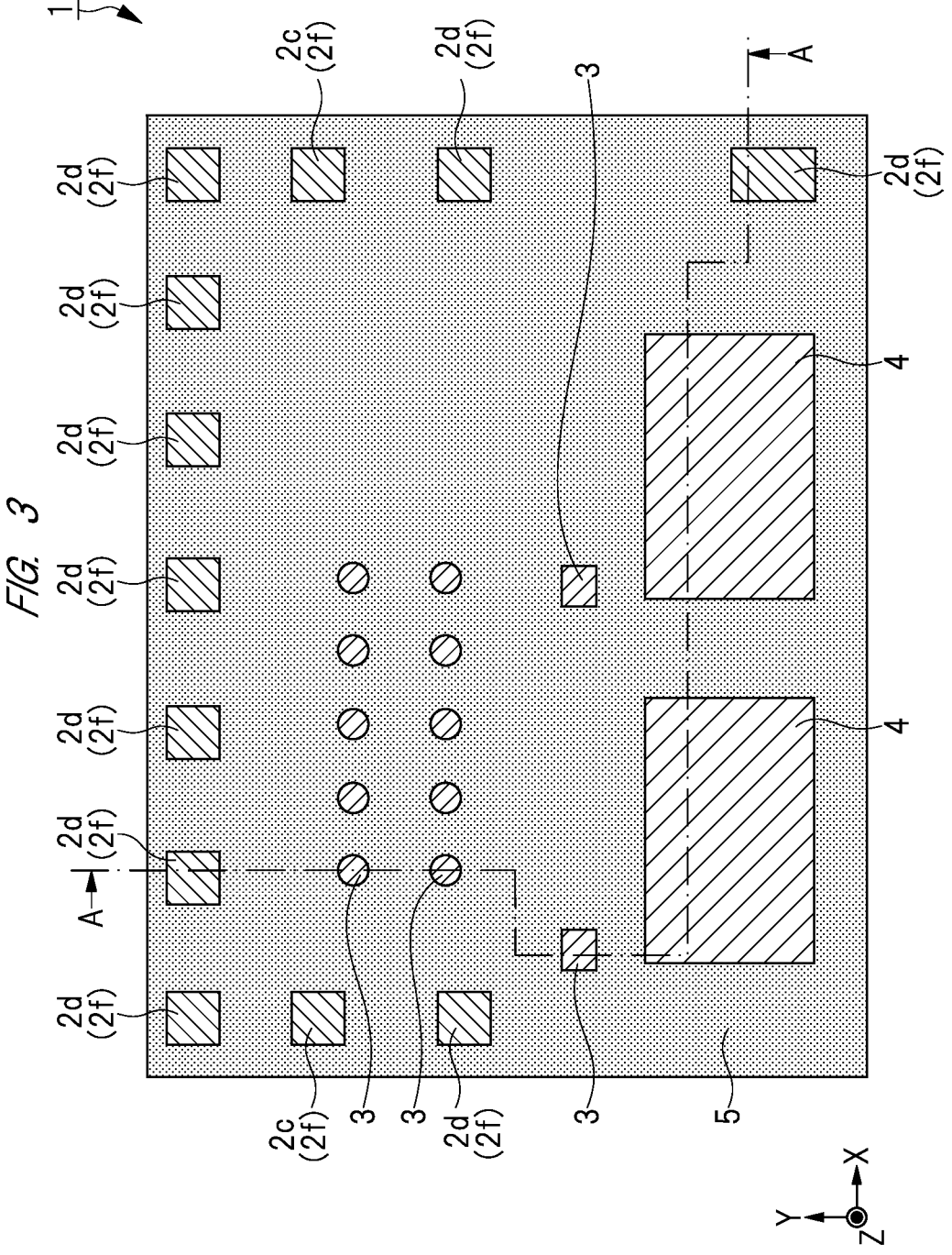
FIG. 3 is a plan view showing the semiconductor device according to the first embodiment.
Figure 4:
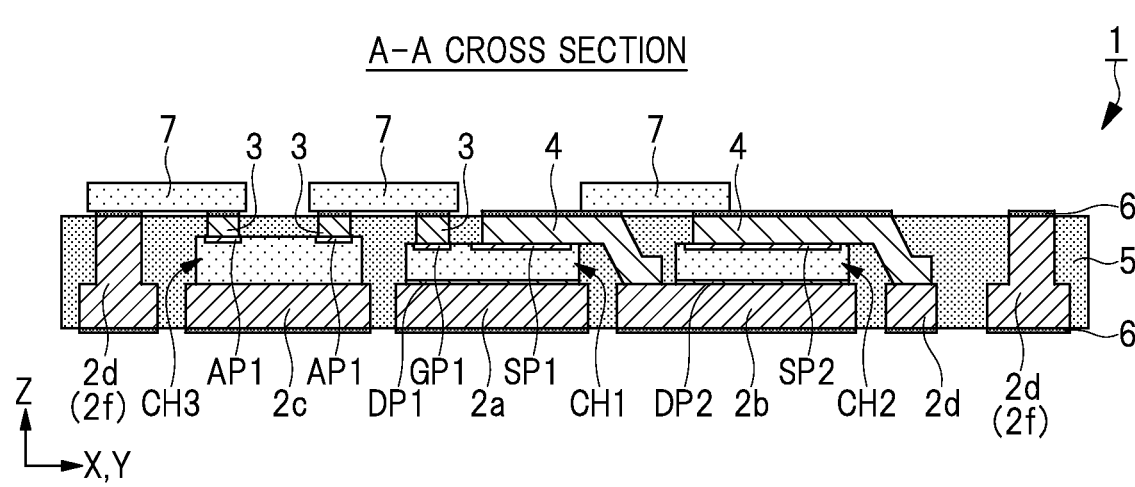
FIG. 4 is a cross-sectional view showing the semiconductor device according to the first embodiment.
Figure 5:
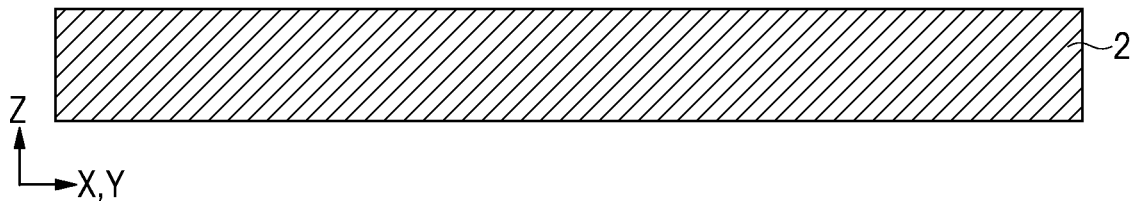
FIG. 5 is a cross-sectional view showing a method of manufacturing the semiconductor device according to the first embodiment.

The mounting structure of the resin-sealed semiconductor device 1 according to the first embodiment will be described below with reference to FIG. 2 to FIG. 4. FIG. 2 and FIG. 3 are plan views showing the semiconductor device 1, and FIG. 2 is a plan view in which a resin layer 5 shown in FIG. 3 is omitted. Further, FIG. 4 is a cross-sectional view taken along the line A-A shown in FIG. 2 and FIG. 3.

The semiconductor device 1 includes semiconductor chips CH1 to CH3. The semiconductor chip CH1 has the MOS transistor Q1 shown in FIG. 1. Although not particularly illustrated, the MOS transistor Q1 includes a source region and a drain region formed in a semiconductor substrate, and includes a gate electrode which is formed between the source region and the drain region and is formed on the semiconductor substrate via a gate insulating film. The MOS transistor Q1 is composed of, for example, a vertical power MOS transistor in which a channel region between the source region and the drain region is formed in a thickness direction of the semiconductor chip CH1.

Further, the semiconductor chip CH1 has a gate pad electrode GP1 and a source pad electrode SP1 formed on an upper surface of the semiconductor chip CH1 and a drain pad electrode DP1 formed on a lower surface of the semiconductor chip CH1.

The gate pad electrode GP1 is formed above the gate electrode and electrically connected to the gate electrode. Also, the source region is electrically connected to the source pad electrode SP1, and the drain region is electrically connected to the drain pad electrode DP1. Namely, the gate pad electrode GP1, the source pad electrode SP1, and the drain pad electrode DP1 correspond to the gate G1, the source S1, and the drain D1 of the equivalent circuit in FIG. 1, respectively.

The semiconductor chip CH2 has the MOS transistor Q2 shown in FIG. 1, and has a gate pad electrode GP2 and a source pad electrode SP2 formed on an upper surface of the semiconductor chip CH2 and a drain pad electrode DP2 formed on a lower surface of the semiconductor chip CH2. The configuration of the MOS transistor Q2 is similar to that of the MOS transistor Q1. Namely, the gate pad electrode GP2, the source pad electrode SP2, and the drain pad electrode DP2 correspond to the gate G2, the source S2, and the drain D2 of the equivalent circuit in FIG. 1, respectively.

The semiconductor chip CH3 has the driver circuit 100 shown in FIG. 1, and has a plurality of pad electrodes AP1 formed on an upper surface of the semiconductor chip CH3. The semiconductor chip CH3 supplies signals for controlling the gate potentials of the gate electrodes of the MOS transistors Q1 and Q2 from the plurality of pad electrodes AP1 to the gate pad electrodes GP1 and GP2.

The gate pad electrodes GP1 and GP2, the source pad electrodes SP1 and SP2, and the pad electrode AP1 mainly contain a conductive material such as an aluminum film. Specifically, these pad electrodes include a relatively thin barrier metal film and a relatively thick aluminum film formed on the barrier metal film. This aluminum film serves as the main body of these pad electrodes. Note that the barrier metal film is a stacked film including, for example, a titanium film and a titanium nitride film. Further, the drain pad electrodes DP1 and DP2 are made of a conductive film, for example, a stacked film of a titanium film, a nickel film, and a gold film.

The semiconductor device 1 includes a die pad 2a, a die pad 2b, a die pad 2c, and a plurality of lead terminals 2d that are physically separated from each other. These are each made of a conductive material and are formed by etching a single metal plate 2. Further, such a conductive material is, for example, copper or a copper alloy in which tin, zirconium, iron, or the like is added to copper.

The semiconductor chip CH1 is provided on an upper surface of the die pad 2a such that the drain pad electrode DP1 is electrically connected to the die pad 2a. The semiconductor chip CH2 is provided on an upper surface of the die pad 2b such that the drain pad electrode DP2 is electrically connected to the die pad 2b. The semiconductor chip CH3 is provided on an upper surface of the die pad 2c.

The drain pad electrodes DP1 and DP2 and the die pads 2a and 2b are bonded to each other by, for example, a conductive adhesive layer such as silver paste. Further, a lower surface of the semiconductor chip CH3 and the die pad 2c are bonded to each other by an adhesive layer, and it is preferable to use a conductive adhesive layer such as solder or silver paste in order to improve heat dissipation.

Note that a thick film region 2f having a thickness larger than the regions where the semiconductor chips CH1 to CH3 are provided is formed in a part of the die pads 2a to 2c and the plurality of lead terminals 2d. Upper and lower surfaces of the thick film region 2f are exposed from the resin layer 5 described later, and can be used as wirings (internal through electrodes) connecting upper and lower surfaces of the semiconductor device 1.

A conductive layer 3 is provided on each upper surface of the gate pad electrode GP1 and the pad electrode AP1 so as to be electrically connected thereto. These conductive layers 3 form columns protruding from each upper surface of the gate pad electrode GP1 and the pad electrode AP1. Although not shown in FIG. 4, a similar conductive layer 3 is provided also on an upper surface of the gate pad electrode GP2 in a cross-sectional view different from FIG. 4.

Also, these conductive layers 3 are mainly made of a material having a lower sheet resistance value than the main material of each of the gate pad electrodes GP1 and GP2 and the pad electrode AP1. Specifically, the conductive layer 3 includes a relatively thin barrier metal film and a relatively thick copper film formed on the barrier metal film. This copper film serves as the main body of the conductive layer 3. Note that the barrier metal film is, for example, a titanium film.

A conductive layer 4 is provided on an upper surface of the source pad electrode SP1 so as to be electrically connected to the source pad electrode SP1 and the die pad 2b. Furthermore, a conductive layer 4 is provided on an upper surface of the source pad electrode SP2 so as to be electrically connected to the source pad electrode SP2 and the lead terminal 2d. The conductive layer 4 is made of, for example, a copper plate subjected to bending process.

The die pads 2a to 2c, the lead terminals 2d, the semiconductor chips CH1 to CH3, the conductive layer 3, and the conductive layer 4 are sealed with the resin layer 5 such that an upper surface of the conductive layer 3, an upper surface of the conductive layer 4, the upper surface of the thick film region 2f, the lower surface of the thick film region 2f, lower surfaces of the lead terminals 2d, and lower surfaces of die pads 2a to 2c are exposed. Note that the resin layer 5 is made of an insulating resin, for example, an epoxy resin.

The positions of each upper surface of the resin layer 5, the conductive layer 3, the conductive layer 4, and the thick film region 2f are almost the same and coincide within a range of 5 □m or less. Namely, each upper surface of the resin layer 5, the conductive layer 3, the conductive layer 4, and the thick film region 2f is substantially on the same plane and is flush with each other. Also, the positions of each lower surface of the thick film region 2f, the lead terminals 2d, and the die pads 2a to 2c are almost the same and coincide within a range of 5 □m or less. Namely, each lower surface of the thick film region 2f, the lead terminals 2d, and the die pads 2a to 2c is substantially on the same plane and is flush with each other.

A plating film 6 is provided on the upper surface of the conductive layer 3, the upper surface of the conductive layer 4, the upper surface of the thick film region 2f, the lower surface of the thick film region 2f, the lower surfaces of the lead terminals 2d, and the lower surfaces of the die pads 2a to 2c. The plating film 6 is made of a conductive material different from the main material of each of the conductive layer 3, the conductive layer 4, the lead terminals 2d, the die pads 2a to 2c, and the thick film region 2f, for example, a silver film, a tin film, or a stacked film thereof.

The passive element member 7 is provided on each upper surface of the conductive layer 3, the conductive layer 4, and the thick film region 2f via the plating film 6 so as to be electrically connected to each of the conductive layer 3, the conductive layer 4, and the thick film region 2f. The passive element member 7 includes one or more passive elements, and the passive element is a resistance element, a coil, or a capacitor. Namely, the passive element member 7 is composed of one or more resistance elements, one or more coils, one or more capacitors, or a combination thereof.

For example, when the passive element member 7 between the gate pad electrode GP1 and the pad electrode AP1 is a resistance element and a coil, the resistance element and the coil can be provided between the driver circuit 100 and the gate G1 as shown in FIG. 1.

Note that it is not necessary that all of the conductive layer 3, the conductive layer 4, and the thick film region 2*f* are connected via the passive element member 7, and the presence or absence of the passive element and the number of passive elements can be changed as appropriate depending on the required circuit design.

Main Effects of First Embodiment

In the first embodiment, the conductive layer 3 is provided on each upper surface of the gate pad electrodes GP1 and GP2 and the pad electrode AP1, and the conductive layer 4 is provided on each upper surface of the source pad electrodes SP1 and SP2. Also, the drain pad electrodes DP1 and DP2 are provided on the upper surfaces of the die pads 2*a* and 2*b* and are electrically connected thereto. Therefore, it is possible to suppress the problem in the case of using a multi-layered board or the like, that is, the problem that the resistance and inductance between respective components increase due to the influence of bonding wires and stacked wirings.

For example, although a signal for controlling the gate potential is supplied from the pad electrode AP1 to the gate pad electrode GP1 between the semiconductor chip CH3 having the driver circuit 100 and the semiconductor chip CH1 having the MOS transistor Q1, the current path between the pad electrode AP1 and the gate pad electrode GP1 can be shortened in the configuration described above. Further, the conductive layer 3, the conductive layer 4, and the die pads 2*a* and 2*b* are mainly made of a material with relatively low sheet resistance such as copper. Therefore, it is possible to suppress the increase in resistance and inductance and reduce the switching loss. Therefore, the performance of the semiconductor device 1 can be improved.

Further, it is easy to provide the passive element member 7 as required between the semiconductor chip CH3, the gate pad electrodes GP1 and GP2, the source pad electrodes SP1 and SP2, and the drain pad electrodes DP1 and DP2, so that the degree of freedom in circuit design can be improved.

For example, since the passive element member 7 can be provided between the conductive layer 4 connected to the source pad electrode SP1 and the conductive layer 4 connected to the source pad electrode SP2, the current loop is minimized and the influence of electromagnetic interference from outside of the semiconductor device 1 can also be reduced. Therefore, the reliability of the semiconductor device 1 can be improved.

Furthermore, since the distances from the gate pad electrodes GP1 and GP2 and the source pad electrodes SP1 and SP2 to the upper surface of the semiconductor device 1 and the distances from the drain pad electrodes DP1 and DP2 to the lower surface of the semiconductor device 1 are short, heat dissipation can be improved.

<Method of Manufacturing Semiconductor Device>

A method of manufacturing the semiconductor device 1 according to the first embodiment will be described below with reference to FIG. 5 to FIG. 11. Note that FIG. 5 to FIG. 11 are cross-sectional views taken along the line A-A like FIG. 4.

First, the metal plate 2 (see FIG. 5) made of a conductive material, the semiconductor chips CH1 to CH3, and the conductive layer 3 are prepared. Note that, at this point, the conductive layer 3 is provided on each of the upper surfaces of the gate pad electrodes GP1 and GP2 of the semiconductor chips CH1 and CH2 and the pad electrode AP1 of the semiconductor chip CH3. Namely, the semiconductor chips CH1 to CH3 are manufactured by cutting a semiconductor wafer into individual pieces by dicing or the like, but the conductive layer 3 is formed on each upper surface of the pad electrodes by using the plating method or the like in the state of the semiconductor wafer.

Figure 6:
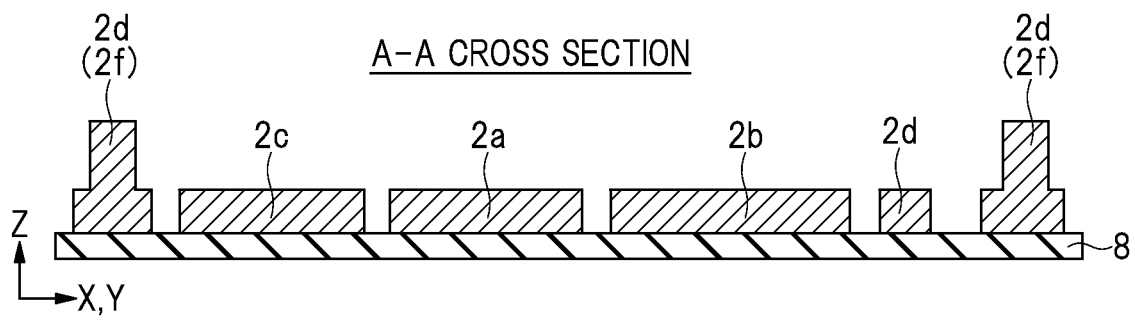
FIG. 6 is a cross-sectional view showing the method of manufacturing the semiconductor device subsequent to FIG. 5.

Next, as shown in FIG. 6, the metal plate 2 is processed to remove a part of the metal plate 2 by etching using a resist pattern or the like as a mask, thereby forming the lead frame. Namely, by selectively etching the metal plate 2, the die pads 2*a* to 2*c* and the lead terminals 2*d* are formed as the lead frame. Note that the region that has not been subjected to the etching by covering a part of the metal plate 2 with a mask is left as the thick film region 2*f* with relatively large thickness.

Thereafter, the metal plate 2 including the die pads 2*a* to 2*c* and the lead terminals 2*d* is disposed on an upper surface of a base material 8. The base material 8 is not particularly limited as long as it can support the mounted objects and is, for example, an adhesive tape such as polyimide tape.

Although not shown, the die pads 2*a* to 2*c* and the lead terminals 2*d* are connected by a frame member and hanging leads. Therefore, it is also possible to manufacture without using the base material 8. Note that the frame member is finally cut out by the dicing process.

Figure 7:
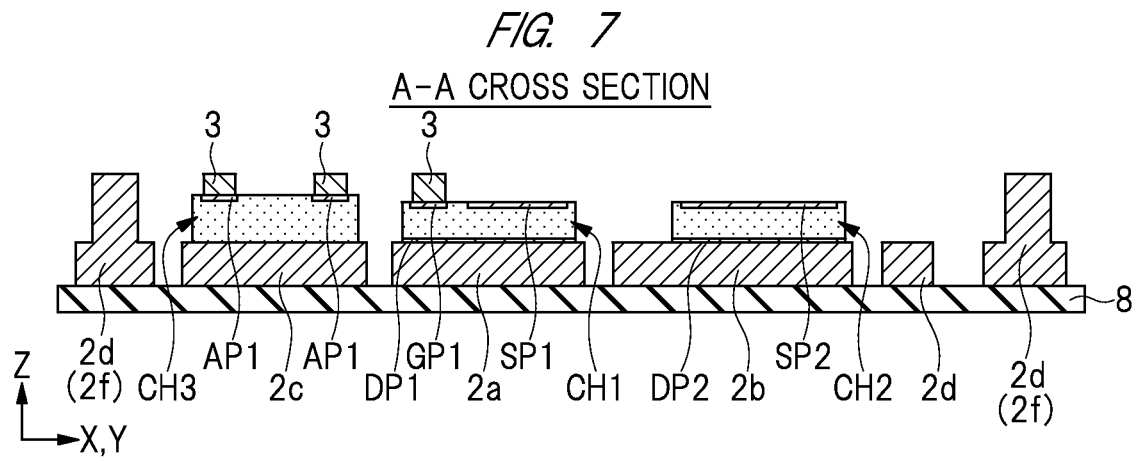
FIG. 7 is a cross-sectional view showing the method of manufacturing the semiconductor device subsequent to FIG. 6.

Next, as shown in FIG. 7, the semiconductor chip CH1 is disposed on the upper surface of the die pad 2*a* via a conductive adhesive layer such as silver paste such that the drain pad electrode DP1 is electrically connected to the die pad 2*a*. Also, the semiconductor chip CH2 is disposed on the upper surface of the die pad 2*b* via the conductive adhesive layer such that the drain pad electrode DP2 is electrically connected to the die pad 2*b*. Further, the semiconductor chip CH3 is disposed on the upper surface of the die pad 2*c* via an insulating adhesive layer such as a thermosetting resin. Note that the order in which the semiconductor chips CH1 to CH3 are disposed is not particularly limited, and it does not matter which one is disposed first.

Figure 8:
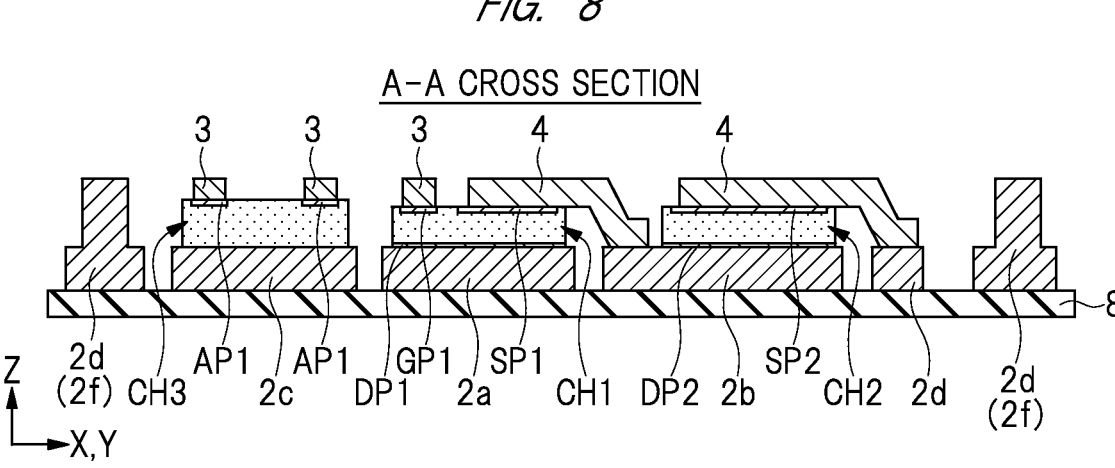
FIG. 8 is a cross-sectional view showing the method of manufacturing the semiconductor device subsequent to FIG. 7.

Next, as shown in FIG. 8, the conductive layer 4 is provided on the upper surface of the source pad electrode SP1 so as to be electrically connected to the source pad electrode SP1 and the die pad 2*b*, and the conductive layer 4 is provided on the upper surface of the source pad electrode SP2 so as to be electrically connected to the source pad electrode SP2 and the lead terminal 2*d*. Note that the conductive layer 4 has been subjected to a bending process in advance.

Figure 9:
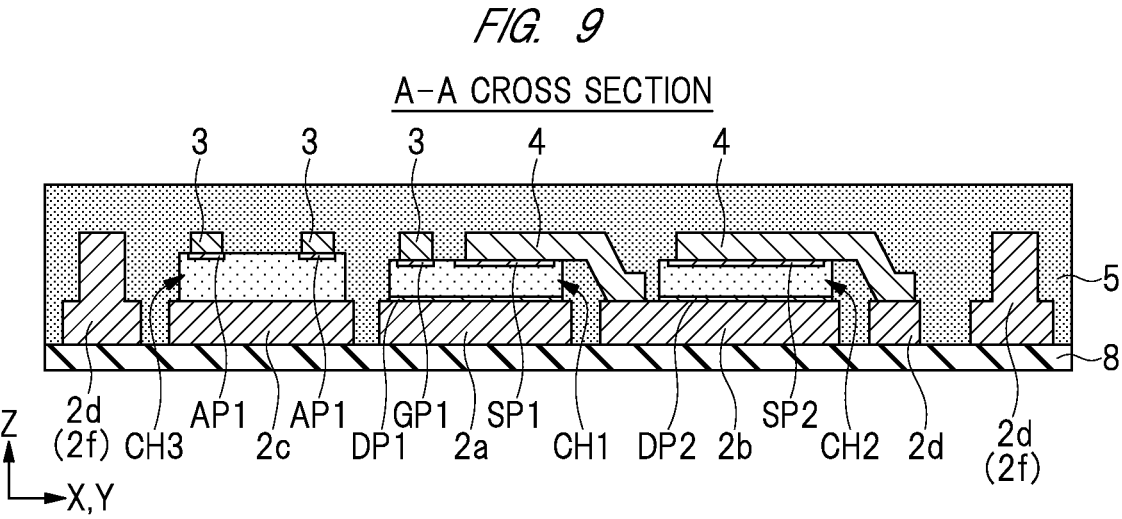
FIG. 9 is a cross-sectional view showing the method of manufacturing the semiconductor device subsequent to FIG. 8.

Next, as shown in FIG. 9, the die pads 2*a* to 2*c*, the lead terminals 2*d*, the semiconductor chips CH1 to CH3, the conductive layer 3, and the conductive layer 4 are sealed with the resin layer 5 so as to cover each upper surface of the conductive layer 3, the conductive layer 4, and the thick film region 2*f*.

Figure 10:
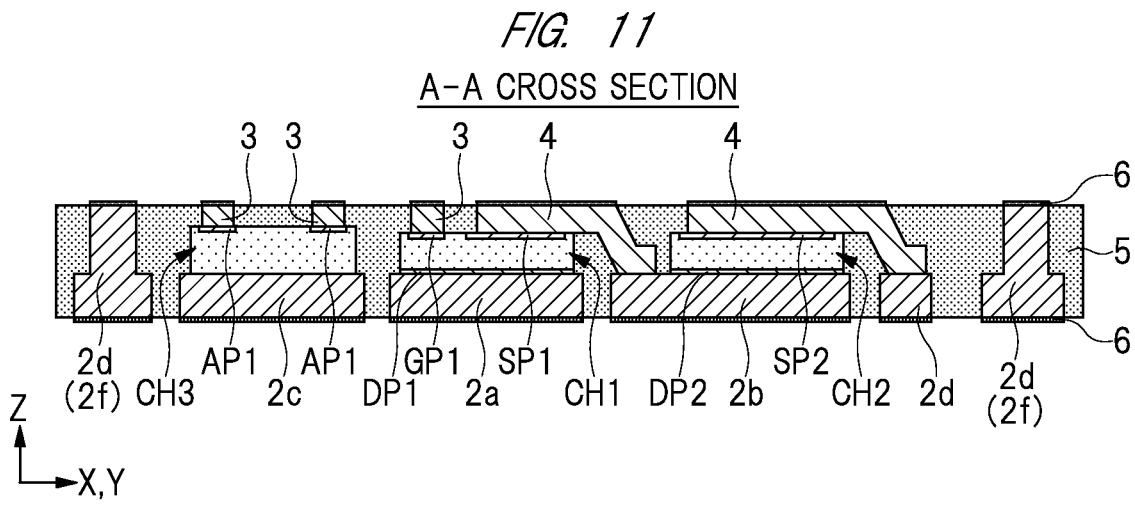
FIG. 10 is a cross-sectional view showing the method of manufacturing the semiconductor device subsequent to FIG. 9.

Next, as shown in FIG. 10, by polishing the resin layer 5, the upper surfaces of the conductive layer 3, the conductive layer 4, and the thick film region 2*f* are exposed from the resin layer 5. Thereafter, the base material 8 is removed. When the base material 8 is an adhesive tape, the base material 8 is peeled off. In this way, the lower surfaces of the thick film region 2f, the lead terminals 2d, and the die pads 2a to 2c are exposed from the resin layer 5.

Note that, in the case of the manufacturing method that does not use the base material 8, resin burrs are likely to occur at the peripheral edges of the lower surfaces of the die pads 2a to 2c and the lead terminals 2d in the sealing process of the resin layer 5. Therefore, it is preferable to perform the process of removing the resin burrs by a hydraulic jet or polishing. In any case, it is sufficient if the upper surfaces of the conductive layer 3, the conductive layer 4, and the thick film region 2f and the lower surfaces of the thick film region 2f, the lead terminals 2d, and the die pads 2a to 2c are exposed from the resin layer 5 after the sealing process of the resin layer 5.

Next, as shown in FIG. 11, the plating film 6 is provided on the upper surface of the conductive layer 3, the upper surface of the conductive layer 4, the upper surface of the thick film region 2f, the lower surface of the thick film region 2f, the lower surfaces of the lead terminals 2d, and the lower surfaces of the die pads 2a to 2c by, for example, the plating method.

Thereafter, the semiconductor device 1 shown in FIG. 4 is manufactured through the following process. That is, the passive element member 7 is provided on each upper surface of the conductive layer 3, the conductive layer 4, and the thick film region 2f via the plating film 6 so as to be electrically connected to each of the conductive layer 3, the conductive layer 4, and the thick film region 2f. Note that the conductive layer 3, the conductive layer 4, and the thick film region 2f may all be connected via the passive element member 7, or only some of them may be connected via the passive element member 7.

Second Embodiment

A semiconductor device 1 according to the second embodiment will be described below with reference to FIG. 12. Note that, in the following description, differences from the first embodiment will be mainly described, and descriptions of the points that overlap with the first embodiment will be omitted.

Figure 12:
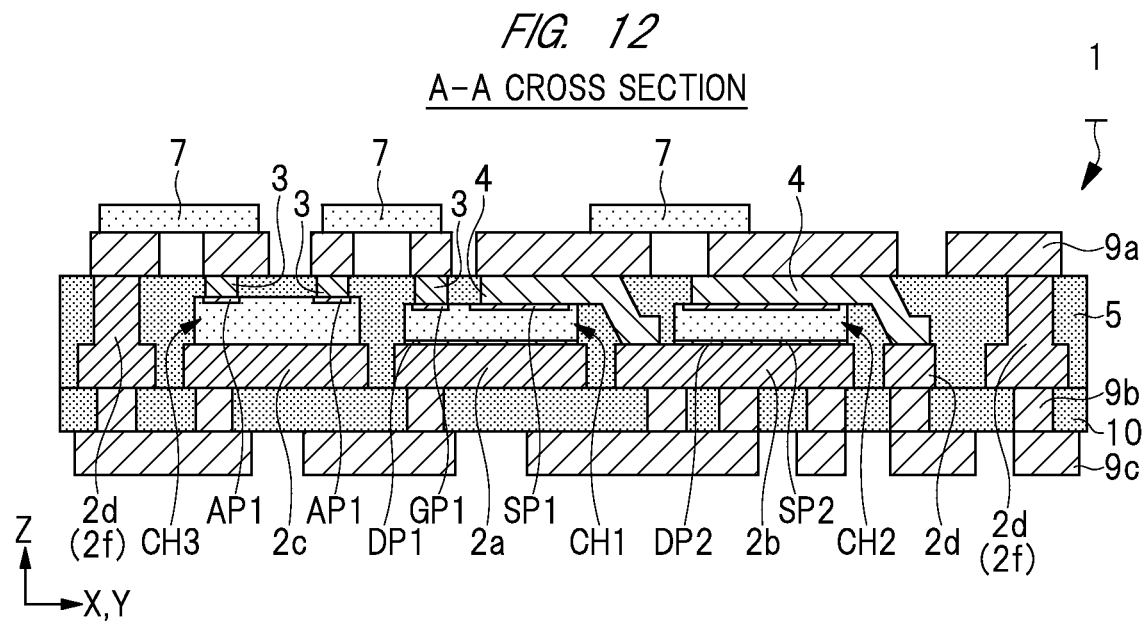
FIG. 12 is a cross-sectional view showing a semiconductor device according to the second embodiment.

As shown in FIG. 12, rewiring layers 9a to 9c are applied in the second embodiment, and the passive element member 7 is provided on an upper surface of the rewiring layer 9a.

Namely, the rewiring layer 9a is provided on each upper surface of the conductive layer 3, the conductive layer 4, and the thick film region 2f so as to be electrically connected to the conductive layer 3, the conductive layer 4, and the thick film region 2f. Then, the passive element member 7 is electrically connected to the conductive layer 3, the conductive layer 4, and the thick film region 2f via the rewiring layer 9a.

Although FIG. 12 illustrates the case where the rewiring layer 9a is located directly above the conductive layer 3, the rewiring layer 9a can be extended to a position away from the conductive layer 3 in plan view. Then, the passive element member 7 can also be arranged over the two rewiring layers 9a at a position away from the conductive layer 3. In this way, by using the rewiring layer 9a, the position of the passive element member 7 can be set freely. Namely, the degree of freedom in layout design of the semiconductor device 1 can be improved.

Note that the rewiring layer 9a is mainly made of a material having a lower sheet resistance value than the main material of each of the gate pad electrodes GP1 and GP2 and the pad electrode AP1. Specifically, the rewiring layer 9a includes a relatively thin barrier metal film and a relatively thick copper film formed on the barrier metal film. This copper film serves as the main body of the rewiring layer 9a. Note that the barrier metal film is, for example, a titanium film, a tantalum film, a chromium film, a titanium nitride film, or a tantalum nitride film.

The rewiring layer 9b and the rewiring layer 9c are provided on each lower surface of the thick film region 2f, the lead terminals 2d, and the die pads 2a to 2c so as to be electrically connected to the thick film region 2f, the lead terminals 2d, and the die pads 2a to 2c. A resin layer 10 made of the same material as the resin layer 5 is provided between the plurality of rewiring layers 9b, and the rewiring layer 9c is provided on each lower surface of the rewiring layer 9b and the resin layer 10.

Furthermore, the rewiring layer 9c can also be extended to a position away from the thick film region 2f, the lead terminals 2d, and the die pads 2a to 2c in plan view. The lower surface of the semiconductor device 1 (the lower surface of the rewiring layer 9c) is mounted on the wiring of the printed wiring board via, for example, solder bumps. At that time, the contact points between the thick film region 2f, the lead terminals 2d, and the die pads 2a to 2c and the wiring of the printed wiring board can be freely set without being restricted by the positions of the thick film region 2f, the lead terminals 2d, and the die pads 2a to 2c. Namely, the presence of the rewiring layer 9c makes it possible to improve the degree of freedom in layout design of the semiconductor device 1 even on the lower surface side of the semiconductor device 1.

Note that the material constituting the rewiring layer 9b and the rewiring layer 9c is the same as the material constituting the rewiring layer 9a.

<Method of Manufacturing Semiconductor Device According to Second Embodiment>

Figure 13:
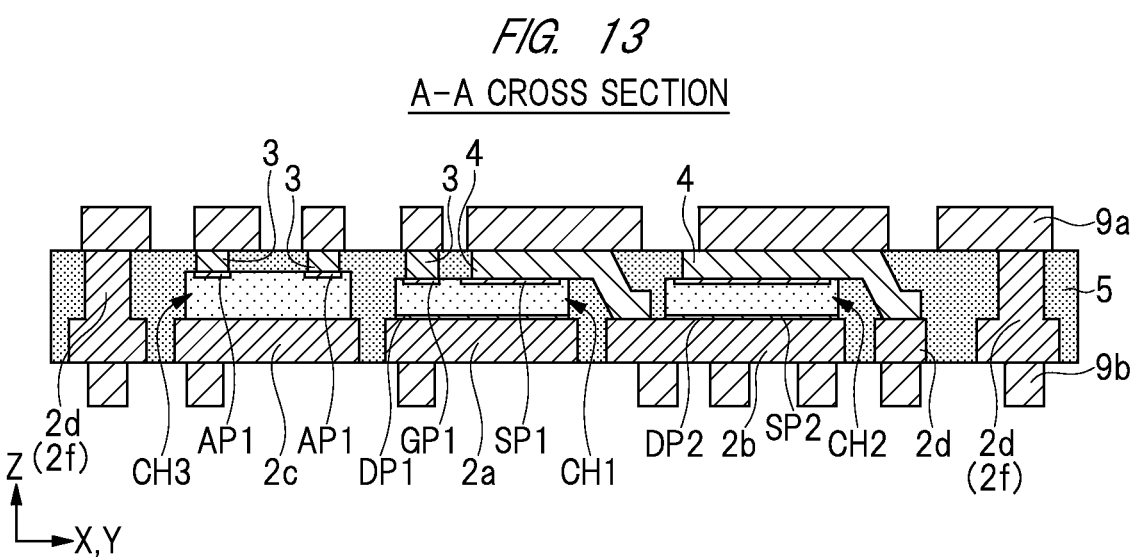
FIG. 13 is a cross-sectional view showing a method of manufacturing the semiconductor device according to the second embodiment.

A method of manufacturing the semiconductor device 1 according to the second embodiment will be described below with reference to FIG. 13 to FIG. 15. Note that the manufacturing method of the second embodiment is the same as the manufacturing method of the first embodiment from FIG. 5 to FIG. 10. FIG. 13 shows the manufacturing method subsequent to FIG. 10.

As shown in FIG. 13, the rewiring layer 9a is provided on each upper surface of the conductive layer 3, the conductive layer 4, and the thick film region 2f so as to be electrically connected to the conductive layer 3, the conductive layer 4, and the thick film region 2f. For example, the rewiring layer 9a can be formed in the following manner.

First, a barrier metal film is formed on each upper surface of the conductive layer 3, the conductive layer 4, the thick film region 2f, and the resin layer 5 by the CVD method or the sputtering method. Next, a seed layer made of copper is formed on the barrier metal film by the sputtering method. Next, a resist pattern opened for the region to form the rewiring layer 9a is formed on the seed layer. Next, a copper film is formed by the plating method on the seed layer exposed from the resist pattern. Next, after removing the resist pattern by the ashing process, the seed layer and the barrier metal film exposed from the copper film are removed. Through the process above, the rewiring layer 9a is formed.

Next, the rewiring layer 9b is provided on each lower surface of the thick film region 2f, the lead terminals 2d, and the die pads 2a to 2c so as to be electrically connected to the thick film region 2f, the lead terminals 2d, and the die pads 2a to 2c. The rewiring layer 9b can be formed by the same manufacturing method as the rewiring layer 9a.

11 12

Figure 14:
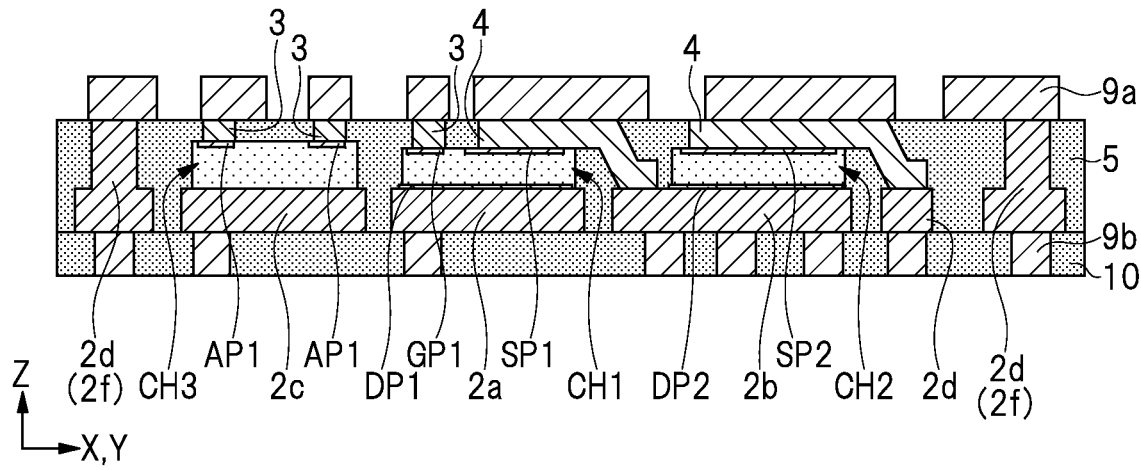
FIG. 14 is a cross-sectional view showing the method of manufacturing the semiconductor device subsequent to FIG. 13.

Next, as shown in FIG. 14, the plurality of rewiring layers 9*b* are sealed with the resin layer 10 so as to cover the lower surfaces of the plurality of rewiring layers 9*b*. Next, by polishing the resin layer 10, the lower surfaces of the plurality of rewiring layers 9*b* are exposed from the resin layer 10.

Figure 15:
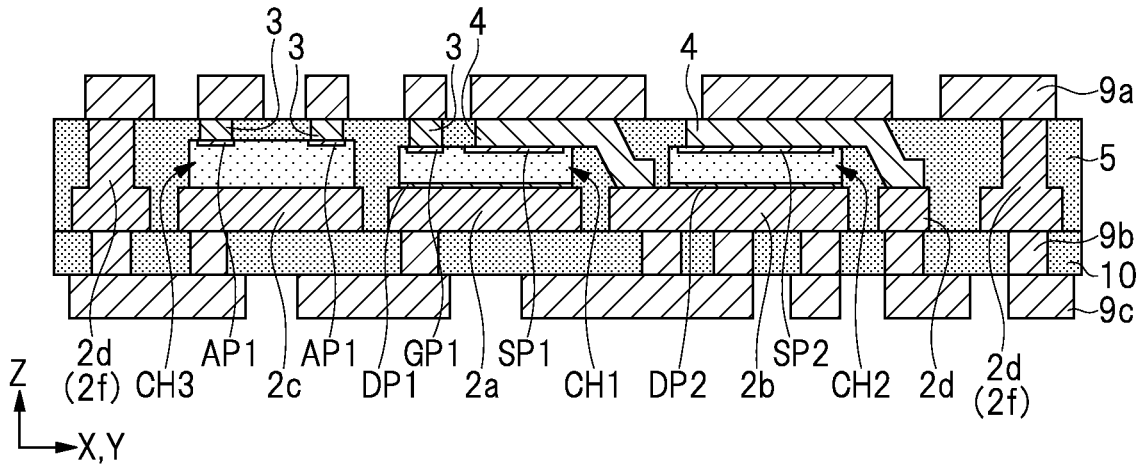
FIG. 15 is a cross-sectional view showing the method of manufacturing the semiconductor device subsequent to FIG. 14.

Next, as shown in FIG. 15, the rewiring layer 9*c* is provided on the lower surface of the rewiring layer 9*b* so as to be electrically connected to the rewiring layer 9*b*. The rewiring layer 9*c* can be formed by the same manufacturing method as the rewiring layer 9*a*. Thereafter, the semiconductor device 1 shown in FIG. 12 is manufactured by providing the passive element member 7 over the upper surfaces of the two rewiring layers 9*a*.

Note that rewiring layers other than the rewiring layers 9*a* to 9*c* can also be formed. Namely, another rewiring layer may be stacked on the upper surface of the rewiring layer 9*a*, and another rewiring layer may be stacked on the lower surface of the rewiring layer 9*c*. The extending directions of the added rewiring layers can be made different from the extending directions of the rewiring layer 9*a* and the rewiring layer 9*c*. Therefore, by adding such rewiring layers, the degree of freedom in layout design can be further improved.

Third Embodiment

Figure 16:
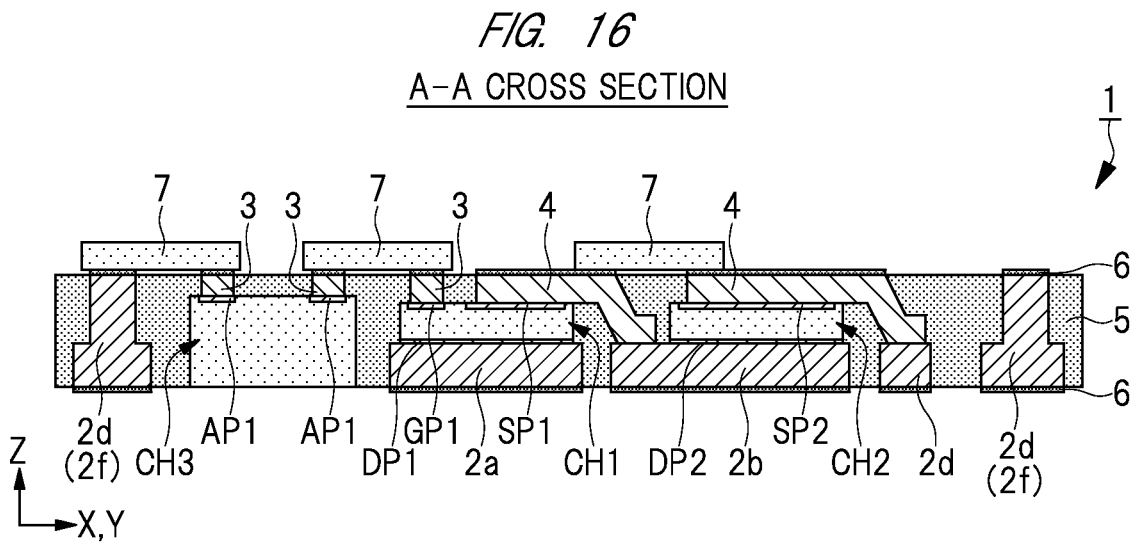
FIG. 16 is a cross-sectional view showing a semiconductor device according to the third embodiment.

A semiconductor device 1 according to the third embodiment will be described below with reference to FIG. 16. Note that, in the following description, differences from the first embodiment will be mainly described, and descriptions of the points that overlap with the first embodiment will be omitted.

In the first embodiment, the semiconductor chip CH3 having the driver circuit 100 is provided on the upper surface of the die pad 2*c*. In the third embodiment, the case where the semiconductor chip CH3 has a large thickness is illustrated. As shown in FIG. 16, the formation of the die pad 2*c* may be omitted for a semiconductor chip that does not have a pad electrode on the lower surface thereof like the semiconductor chip CH3. In this case, the semiconductor chip CH3 may be directly provided on the base material 8 in the manufacturing process of FIG. 7 without forming the die pad 2*c* in the manufacturing process of FIG. 6.

Note that, in the semiconductor device 1 according to the third embodiment, the case in which the plating film 6 is provided on the upper surface of the conductive layer 3 and the like is illustrated as in the first embodiment, but the rewiring layers 9*a* to 9*c* described in the second embodiment can also be applied to the semiconductor device 1 according to the third embodiment.

In the foregoing, the present invention has been specifically described based on the above embodiments. However, the present invention is not limited to the above embodiments and various modifications can be made within the range not departing from the gist thereof.

For example, the present invention can be applied even when the semiconductor chips CH1 and CH2 are turned upside down. In that case, the gate pad electrodes GP1 and GP2 and the source pad electrodes SP1 and SP2 are disposed on different die pads, respectively, and the conductive layer 3 is provided on the drain pad electrodes DP1 and DP2. It is also possible to realize the equivalent circuit shown in FIG. 1 by appropriately electrically connecting the wiring of the printed wiring board or the rewiring layers 9*b* and 9*c* of the second embodiment to each die pad.

The invention claimed is:

1. A semiconductor device comprising:
a first die pad made of a conductive material;
a first semiconductor chip provided on an upper surface of the first die pad; and
a second semiconductor chip,
wherein the first semiconductor chip has a first pad electrode formed on an upper surface of the first semiconductor chip and a third pad electrode formed on a lower surface of the first semiconductor chip and electrically connected to the first die pad,
wherein the second semiconductor chip has a second pad electrode formed on an upper surface of the second semiconductor chip,
wherein a first conductive layer is provided on an upper surface of the first pad electrode so as to be electrically connected to the first pad electrode,
wherein a second conductive layer is provided on an upper surface of the second pad electrode so as to be electrically connected to the second pad electrode,
wherein the first die pad, the first semiconductor chip, the second semiconductor chip, the first conductive layer, and the second conductive layer are sealed with a first resin layer such that an upper surface of the first conductive layer, an upper surface of the second conductive layer, and a lower surface of the first die pad are exposed, and
wherein one or more passive elements are disposed on each upper surface of the first conductive layer and the second conductive layer so as to be electrically connected to the first conductive layer and the second conductive layer.

2. The semiconductor device according to claim 1, further comprising
a second die pad made of a conductive material and physically separated from the first die pad,
wherein the second semiconductor chip is provided on an upper surface of the second die pad, and
wherein the first die pad, the first semiconductor chip, the second semiconductor chip, the first conductive layer, the second conductive layer, and the second die pad are sealed with the first resin layer such that the upper surface of the first conductive layer, the upper surface of the second conductive layer, the lower surface of the first die pad, and a lower surface of the second die pad are exposed.

3. The semiconductor device according to claim 1,
wherein a plating film made of a conductive material different from a main material of each of the first conductive layer and the second conductive layer is provided on each upper surface of the first conductive layer and the second conductive layer, and
wherein the one or more passive elements are electrically connected to the first conductive layer and the second conductive layer via the plating film.

4. The semiconductor device according to claim 1,
wherein a first rewiring layer is provided on the upper surface of the first conductive layer so as to be electrically connected to the first conductive layer,
wherein a second rewiring layer is provided on the upper surface of the second conductive layer so as to be electrically connected to the second conductive layer,
wherein the one or more passive elements are electrically connected to the first conductive layer and the second conductive layer via the first rewiring layer and the second rewiring layer, and wherein the first rewiring layer extends to a position away from the first conductive layer and the second rewiring layer extends to a position away from the second conductive layer in plan view.

5. The semiconductor device according to claim 4, wherein a third rewiring layer is provided on the lower surface of the first die pad so as to be electrically connected to the first die pad, and wherein the third rewiring layer extends to a position away from the first die pad in plan view.

6. The semiconductor device according to claim 4, wherein each of the first rewiring layer and the second rewiring layer is mainly made of a conductive material having a lower sheet resistance value than a main material of each of the first pad electrode and the second pad electrode.

7. The semiconductor device according to claim 1, wherein each of the first conductive layer and the second conductive layer is mainly made of a material having a lower sheet resistance value than a main material of each of the first pad electrode and the second pad electrode, and forms a column protruding from each upper surface of the first pad electrode and the second pad electrode.

8. The semiconductor device according to claim 1, wherein positions of each upper surface of the first conductive layer, the second conductive layer, and the first resin layer coincide within a range of 5 □m or less, and wherein positions of each lower surface of the first die pad and the first resin layer coincide within a range of 5 □m or less.

9. The semiconductor device according to claim 1, wherein the first semiconductor chip includes a first MOS transistor having a first gate electrode, a first source region, and a first drain region, wherein the first pad electrode is a first gate pad electrode electrically connected to the first gate electrode and formed above the first gate electrode, and wherein the second semiconductor chip includes a driver circuit configured to supply a signal for controlling a gate potential of the first gate electrode from the second pad electrode.

10. The semiconductor device according to claim 1, wherein the one or more passive elements are composed of one or more resistance elements, one or more coils, one or more capacitors, or a combination thereof.

11. A method of manufacturing a semiconductor device comprising steps of:

(a) preparing a metal plate made of a conductive material, a first semiconductor chip having a first pad electrode formed on an upper surface thereof and a third pad electrode formed on a lower surface thereof, a second semiconductor chip having a second pad electrode formed on an upper surface thereof, a first conductive layer provided on an upper surface of the first pad electrode and electrically connected to the first pad electrode, and a second conductive layer provided on an upper surface of the second pad electrode and electrically connected to the second pad electrode;

(b) after the step (a), forming a first die pad by selectively etching the metal plate;

(c) after the step (b), disposing the first semiconductor chip on an upper surface of the first die pad such that the third pad electrode is electrically connected to the first die pad;

(d) after the step (c), sealing the first die pad, the first semiconductor chip, the second semiconductor chip, the first conductive layer, and the second conductive layer with a first resin layer so as to cover each upper surface of the first conductive layer and the second conductive layer;

(e) after the step (d), polishing the first resin layer to expose each upper surface of the first conductive layer and the second conductive layer from the first resin layer;

(f) after the step (e), exposing a lower surface of the first die pad from the first resin layer; and (g) after the step (f), providing one or more passive elements on each upper surface of the first conductive layer and the second conductive layer so as to be electrically connected to the first conductive layer and the second conductive layer.

12. The method of manufacturing a semiconductor device according to claim 11, wherein, in the step (b), a second die pad physically separated from the first die pad is also formed, wherein, after the step (b), the second semiconductor chip is disposed on an upper surface of the second die pad, wherein, in the step (d), the first die pad, the first semiconductor chip, the second semiconductor chip, the first conductive layer, the second conductive layer, and the second die pad are sealed with the first resin layer, and wherein, in the step (f), the lower surface of the first die pad and a lower surface of the second die pad are exposed from the first resin layer.

13. The method of manufacturing a semiconductor device according to claim 11, further comprising a step of (h) between the step (f) and the step (g), providing a plating film made of a material different from a main material of each of the first conductive layer and the second conductive layer on each upper surface of the first conductive layer and the second conductive layer, wherein, in the step (g), the one or more passive elements are electrically connected to the first conductive layer and the second conductive layer via the plating film.

14. The method of manufacturing a semiconductor device according to claim 11, further comprising a step of (i) between the step (f) and the step (g), providing a first rewiring layer on the upper surface of the first conductive layer so as to be electrically connected to the first conductive layer and providing a second rewiring layer on the upper surface of the second conductive layer so as to be electrically connected to the second conductive layer, wherein, in the step (g), the one or more passive elements are electrically connected to the first conductive layer and the second conductive layer via the first rewiring layer and the second rewiring layer, and wherein the first rewiring layer extends to a position away from the first conductive layer and the second rewiring layer extends to a position away from the second conductive layer in plan view.

15. The method of manufacturing a semiconductor device according to claim 14, further comprising a step of (j) between the step (f) and the step (g), providing a third rewiring layer on the lower surface of the first die pad so as to be electrically connected to the first die pad, wherein the third rewiring layer extends to a position away from the first die pad in plan view.

16. The method of manufacturing a semiconductor device according to claim 14, wherein each of the first rewiring layer and the second rewiring layer is mainly made of a material having a lower sheet resistance value than a main material of each of the first pad electrode and the second pad electrode.

17. The method of manufacturing a semiconductor device according to claim 11, wherein each of the first conductive layer and the second conductive layer is mainly made of a material having a lower sheet resistance value than a main material of each of the first pad electrode and the second pad electrode, and forms a column protruding from each upper surface of the first pad electrode and the second pad electrode.

18. The method of manufacturing a semiconductor device according to claim 11, wherein the first semiconductor chip includes a first MOS transistor having a first gate electrode, a first source region, and a first drain region, wherein the first pad electrode is a first gate pad electrode electrically connected to the first gate electrode and formed above the first gate electrode, and wherein the second semiconductor chip includes a driver circuit configured to supply a signal for controlling a gate potential of the first gate electrode from the second pad electrode.

19. The method of manufacturing a semiconductor device according to claim 11, wherein the one or more passive elements are composed of one or more resistance elements, one or more coils, one or more capacitors, or a combination thereof.

20. The method of manufacturing a semiconductor device according to claim 11, further comprising a step of (k) between the step (b) and the step (c), disposing the metal plate including the first die pad on an upper surface of a base material, wherein the step (f) is performed by removing the base material.

* * * * *